(12) United States Patent
Kato et al.

(10) Patent No.: US 8,377,340 B2
(45) Date of Patent: Feb. 19, 2013

(54) ELECTROMAGNETIC WAVE SUPPRESSION SHEET, DEVICE, AND ELECTRONIC APPARATUS

(75) Inventors: Yoshihiro Kato, Kanagawa (JP); Yoshito Ikeda, Tochigi (JP)

(73) Assignee: Sony Corporation, Tokyo (JP)

( * ) Notice: Subject to any disclaimer, the term of this patent is extended or adjusted under 35 U.S.C. 154(b) by 489 days.

(21) Appl. No.: 12/630,971

(22) Filed: Dec. 4, 2009

(65) Prior Publication Data

US 2010/0139971 A1 Jun. 10, 2010

(30) Foreign Application Priority Data

Dec. 8, 2008 (JP) ................................. 2008-312553

(51) Int. Cl.
*H01B 1/22* (2006.01)
*G21F 1/08* (2006.01)
(52) U.S. Cl. ................. 252/513; 250/515.1; 439/607.02
(58) Field of Classification Search .......... 252/512–514, 252/518.1; 250/515.1; 439/607.02
See application file for complete search history.

(56) References Cited

U.S. PATENT DOCUMENTS

| 4,856,023 | A |   | 8/1989 | Singh |   |
|---|---|---|---|---|---|
| 5,639,989 | A | * | 6/1997 | Higgins, III | 174/386 |
| 8,017,255 | B2 | * | 9/2011 | Kawaguchi et al. | 428/692.1 |
| 2005/0183871 | A1 | * | 8/2005 | Hou | 174/35 MS |
| 2006/0249705 | A1 | * | 11/2006 | Wang et al. | 252/62.51 C |

FOREIGN PATENT DOCUMENTS

| JP | 64-068999 | 3/1989 |
| JP | 2-500474 | 2/1990 |
| JP | 03-116899 | 5/1991 |
| JP | 06-232587 | 8/1994 |
| JP | 11-087980 | 3/1999 |
| JP | 2003-142876 | 5/2003 |
| JP | 2003-174279 | 6/2003 |
| JP | 2003-243879 | 8/2003 |
| JP | 2005-142551 | 6/2005 |
| WO | 2007/114455 | 10/2007 |

OTHER PUBLICATIONS

Japanese Office Action issued on Sep. 11, 2009 in connection with counterpart JP Application No. 2008-312553 (no English tranlation).

* cited by examiner

*Primary Examiner* — Mark Kopec
(74) *Attorney, Agent, or Firm* — SNR Denton US LLP

(57) ABSTRACT

Disclosed is an electromagnetic wave suppression sheet obtained by mixing metallic magnetic particles into a resin and formed into a sheet shape. In the electromagnetic wave suppression sheet, a coercive force is 320 [A/m] or more and a saturation magnetization is 0.35 [Wb/m$^2$] or more at a time when an external magnetic field of 1 kOe in an in-plane direction is applied.

18 Claims, 8 Drawing Sheets

20

ELECTROMAGNETIC WAVE SUPPRESSION SHEET, DEVICE, AND ELECTRONIC APPARATUS

BACKGROUND OF THE INVENTION

1. Field of the Invention

The present invention relates to an electromagnetic wave suppression sheet including an electromagnetic wave suppression material used for a countermeasure against an unnecessary radiation generated from an electronic apparatus, to a device including an electromagnetic wave suppression sheet, and to an electronic apparatus equipped with an electromagnetic wave suppression sheet. In particular, the present invention is suitable for electromagnetic wave suppression in a GHz band.

2. Description of the Related Art

Along with the rapid popularization of recent telecommunication equipment, electromagnetic waves in a GHz band for a mobile phone (1.5, 2.0 GHz), a PHS (1.9 GHz), a wireless LAN (2.45 GHz, 5.0 GHz), or the like are rapidly increasingly used.

Further, there are an increasing number of apparatuses whose LSI drive frequencies exceed GHz, and their harmonics have higher-frequency components.

As described above, the number of potential electromagnetic wave generation sources, the number of interference-affected objects, and varieties thereof are being increased at an exponential rate. Therefore, the risk of causing an electromagnetic interference (EMI) in the GHz band is being astronomically increased.

To cope with a problem of the electromagnetic interference, it is necessary for individual apparatuses to have a sufficient immunity against an electromagnetic wave from outside (improvement of immunity) without emitting an unnecessary electromagnetic wave that hinders normal operations of other apparatuses (suppression of emission).

This is called electromagnetic compatibility (EMC). Various standards are defined in order for an electronic apparatus to establish the electromagnetic compatibility in an electromagnetic environment.

These days, as a method of overcoming a problem of the electromagnetic interference, an electromagnetic wave suppression sheet (electromagnetic wave absorption sheet) is being used. A general electromagnetic wave suppression sheet has a composite structure of a resin and magnetic material particles or conductive material particles, for example (see, for example, Japanese Patent Application Laid-open No. 2003-174279 (hereinafter, referred to as Patent Document 1)).

Here, a mechanism of conversion to heat energy is classified into three types of a conductive loss, a dielectric loss, and a magnetic loss. At this time, an electromagnetic wave absorption energy P (W/m$^3$) per unit volume is expressed as the following expression (1)

$$P = \tfrac{1}{2}\sigma|E|^2 + \pi f \epsilon''|E|^2 + \pi f \mu''|H|^2 \qquad (1)$$

where E represents an electric field, H represents a magnetic field, f represents a frequency of the electro magnetic wave, $\sigma$ represents an electric conductivity, $\epsilon$ represents a complex electric conductivity ($\epsilon = \epsilon' - j\epsilon''$), and $\mu$ represents a complex magnetic permeability ($\mu = \mu' - j\mu''$).

In the expression (1), the first term expresses the electric conductivity loss, the second term expresses the dielectric loss, and the third term expresses the magnetic loss.

The electromagnetic wave suppression sheet used for the countermeasure for a part in which a large current change occurs is generally made of a magnetic material.

To suppress and absorb the magnetic components of the electromagnetic wave, the electromagnetic wave suppression sheet made of the magnetic material is designed so that an imaginary part $\mu''$ of the magnetic permeability of the third term that expresses the magnetic loss in the above expression (1) is high.

The electromagnetic wave suppression sheet as described above is bonded on an LSI package, a printed circuit board, an FPC (flexible printed circuit), a harness, a metallic component, or the like, and implemented.

In addition, to increase an antenna efficiency for RFID, the electromagnetic wave suppression sheet is used, thereby suppressing the interference between an antenna and a metallic part.

SUMMARY OF THE INVENTION

However, the existing electromagnetic wave suppression sheet mainly targets on the use in a MHz band. In this frequency band, a large imaginary part $\mu''$ of the magnetic permeability is obtained, but characteristics thereof decrease when the frequency band exceeds 1 GHz (Snoek's limit).

Here, the magnetic permeability (imaginary part $\mu_r''$ of a relative magnetic permeability) was measured for several kinds of commercially-available electromagnetic wave suppression sheets. FIG. 11 shows the measurement result.

Incidentally, (relative magnetic permeability: $\mu_r$)=(magnetic permeability: $\mu$)/(magnetic permeability in vacuum: $\mu_0$) is established.

As shown in FIG. 11, the imaginary part $\mu_r''$ of the relative magnetic permeability had a significantly large value in the MHz band but intensely decreased in the GHz band. At 5 GHz, the value of the imaginary part $\mu_r''$ was less than 3.

In view of the above-mentioned circumstances, it is desirable to provide an electromagnetic wave suppression sheet that has a sufficient magnetic permeability even in the GHz band and is capable of exerting a sufficient electromagnetic wave suppression effect. In addition, it is desirable to provide a device and an electronic apparatus that include the electromagnetic wave suppression sheet.

According to an embodiment of the present invention, there is provided an electromagnetic wave suppression sheet obtained by mixing metallic magnetic particles into a resin and formed into a sheet shape. In the electromagnetic wave suppression sheet, a coercive force is 320 [A/m] or more and a saturation magnetization is 0.35 [Wb/m$^2$] or more at a time when an external magnetic field of 1 kOe in an in-plane direction is applied.

According to another embodiment of the present invention, there is provided a device including a package of an integrated circuit element and an electromagnetic wave suppression sheet bonded to the package of the integrated circuit element. The electromagnetic wave suppression sheet has the structure according to the embodiment of the present invention.

According to another embodiment of the present invention, there is provided an electronic apparatus including an integrated circuit element, a wiring, and an electromagnetic wave suppression sheet disposed in a vicinity of one of the integrated circuit element and the wiring. The electromagnetic wave suppression sheet has the structure according to the embodiment of the present invention.

With the structure of the electromagnetic wave suppression sheet according to the embodiment of the present invention, a coercive force is 320 [A/m] or more and a saturation magnetization is 0.35 [Wb/m²] or more at a time when an external magnetic field of 1 kOe in an in-plane direction of the sheet is applied. Therefore, a value of an imaginary part of a relative magnetic permeability of the electromagnetic wave suppression sheet at 5 GHz can be large, specifically, 3 or more.

With the structures of the device according to the embodiment of the present invention and the electronic apparatus according to the embodiment of the present invention, because the device and the electronic apparatus each include the electromagnetic wave suppression sheet according to the embodiment of the present invention, the value of the imaginary part of the relative magnetic permeability of the electromagnetic wave suppression sheet at 5 GHz can be large, specifically, 3 or more.

According to the embodiments of the present invention described above, the value of the imaginary part of the relative magnetic permeability of the electromagnetic wave suppression sheet can be large, specifically, 3 or more. Therefore, it becomes possible to exert a sufficient electromagnetic wave suppression effect even in the GHz band.

Thus, according to the embodiments of the present invention, it is possible to realize a high drive frequency in the GHz band and suppression of an electromagnetic interference at the same time in the electronic apparatus.

These and other objects, features and advantages of the present invention will become more apparent in light of the following detailed description of best mode embodiments thereof, as illustrated in the accompanying drawings.

DESCRIPTION OF PREFERRED EMBODIMENT

Figure 1:
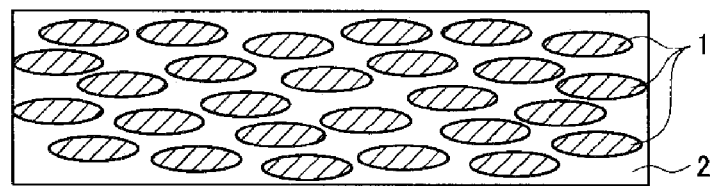
FIG. 1 is a schematic structural diagram (cross-sectional view) of an electromagnetic wave suppression sheet of a first example according to an embodiment of the present invention.

Hereinafter, an embodiment of the present invention will be described with reference to the drawings.

It should be noted that the description will be given in the following order.
1. Outline of present invention
2. First example of electromagnetic wave suppression sheet
3. Second example of electromagnetic wave suppression sheet
4. Third example of electromagnetic wave suppression sheet
5. Example of device
6. Example of electronic apparatus 1. Outline of Present Invention First, prior to a specific description of the embodiment of the present invention, the outline of the present invention will be described.

It is a common knowledge that a ferromagnetic resonant frequency fr is obtained from the following expression.

$$fr = \gamma/2\pi\sqrt{\{Hr+1/\mu_0(Nx-Nz)I+(Hax-Haz)\}\{Hr+1/\mu_0(Ny-Nz)+(Hay-Haz)\}} \quad (2)$$

In the expression (2), γ represents a gyro magnetic ratio, Hr represents an external direct-current resonant magnetic field in a z direction, Nx, Ny, and Nz each represent a diamagnetic field coefficient of a spheroid in a main-axis direction, Hax, Hay, and Haz each represent an anisotropy magnetic field, and I represents magnetization.

Based on the expression (2), it is found that with increase in the anisotropy magnetic field and magnetization, the resonant frequency also tends to increase.

As the anisotropy magnetic field in the electromagnetic wave suppression sheet, crystal magnetic anisotropy and shape anisotropy can be considered.

The inventors of the present invention have focused their attentions on the coercive force and the shape of a magnetic particle that determine the anisotropy magnetic field and have studied an optimal material design that can provide a high magnetic permeability in the GHz band.

Even when magnetic particles having most desirable magnetic characteristics are used, in a case where the magnetic particles are mixed with a resin and the mixture is formed into a sheet, the magnetic characteristics of the sheet is significantly changed also depending on the mixture state. That is, for the design, development, and evaluation of the electromagnetic wave suppression sheet, taking only the magnetic characteristics of the magnetic particles into consideration is insufficient. It is necessary to take into consideration magnetic characteristics of a device itself in a state of a sheet.

In view of this, the inventors of the present invention have studied optimization of the magnetic characteristics of the coercive force and the saturation magnetization in the sheet state, in addition to the material design.

In Patent Document 1, an attention is focused on the magnetic characteristics of magnetic particles, and a sheet obtained by mixing the magnetic particles having desirable magnetic characteristics with a resin is formed.

However, even when the magnetic particles having the desirable magnetic characteristics are used, at a time when the magnetic particles are mixed with the resin into a sheet state, the magnetic characteristics as a sheet device are significantly changed depending on a mixture ratio of the resin and the magnetic particles or a dispersion state of the magnetic particles in the resin. For this reason, as described above, it is difficult to specifically design magnetic characteristics of the electromagnetic wave suppression sheet only by taking the magnetic characteristics of the magnetic particles into consideration, and it is necessary to also focus an attention on the magnetic characteristics in the sheet state for the design.

With this point in mind, the inventors of the present invention have made an electromagnetic wave suppression sheet that can operate in the GHz band according to the present invention.

The electromagnetic wave suppression sheet according to the present invention is obtained by mixing metallic magnetic particles into a resin and forming the mixture into a sheet shape. Further, the electromagnetic wave suppression sheet of the present invention has the following magnetic characteristics. That is, the electromagnetic wave suppression sheet has a coercive force of 320 [A/m] or more and a saturation magnetization of 0.35 [Wb/m$^2$] or more at a time when an external magnetic field of 1 kOe in an in-plane direction of the sheet is applied.

Examples of the material of the metallic magnetic particles of the electromagnetic wave suppression sheet include metallic magnetic materials as follows:

Fe, Co, a Fe—Al—Si-based alloy, a Fe—Si—Cr-based alloy, a Fe—Si-based alloy, a Fe—Ni-based alloy, a Fe—Co-based alloy, a Fe—Co—Ni-based alloy, and a Fe—Cr-based alloy.

By selecting at least one material from among those metallic magnetic materials, the metallic magnetic particles can be formed.

Further, it is more desirable that a flat or spherical metallic magnetic particle is used for the metallic magnetic particle. By using the flat or spherical metallic magnetic particle, it becomes possible to easily obtain desired magnetic characteristics.

As the resin for the electromagnetic wave suppression sheet, a resin similar to that for an electromagnetic wave suppression sheet in related art can be used.

For example, an acrylic resin, a silicone-based resin, or the like can be used.

Figure 2:
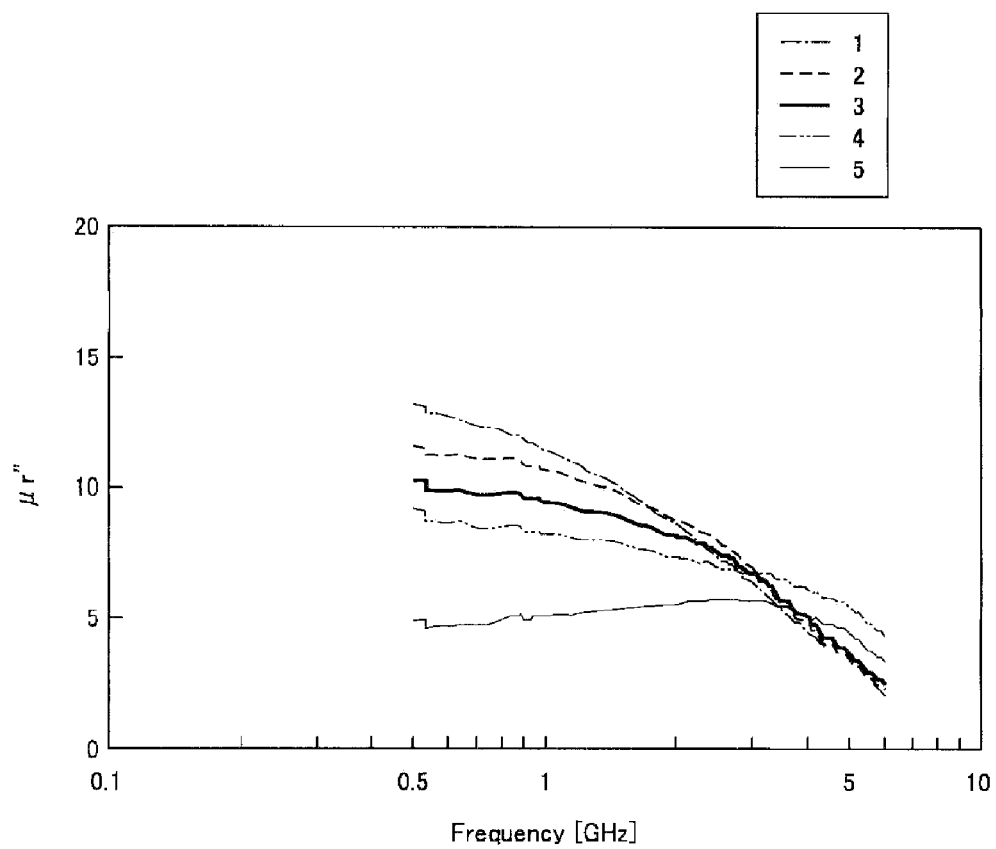
FIG. 2 is a graph showing frequency dispersion characteristics of an imaginary part $\mu_r''$ of a relative magnetic permeability of each of electromagnetic wave suppression sheets.

Here, FIG. 2 shows the frequency dispersion characteristic of the imaginary part $\mu_r''$ of the relative magnetic permeability in the electromagnetic wave suppression sheet obtained by mixing the metallic magnetic particles with the resin.

It should be noted that Fe—Si—Cr-based alloy particles are used as the metallic magnetic particles for five kinds of samples (samples 1 to 5) of the electromagnetic wave suppression sheet shown in FIG. 2.

As shown in FIG. 2, the sample 1 had the largest magnetic permeability characteristic in the MHz band. But, the magnetic permeability characteristic thereof decreased in the GHz band, and the imaginary part $\mu_r''$ thereof was about 3 at 5 GHz.

On the other hand, the imaginary part $\mu_r''$ of the sample 4 was smaller than that of the sample 1 in the MHz band but maintained at a constant $\mu_r''$ value as compared to the other samples in the GHz band, specifically, 3 or more (about 5.5) at 5 GHz.

Figure 11:
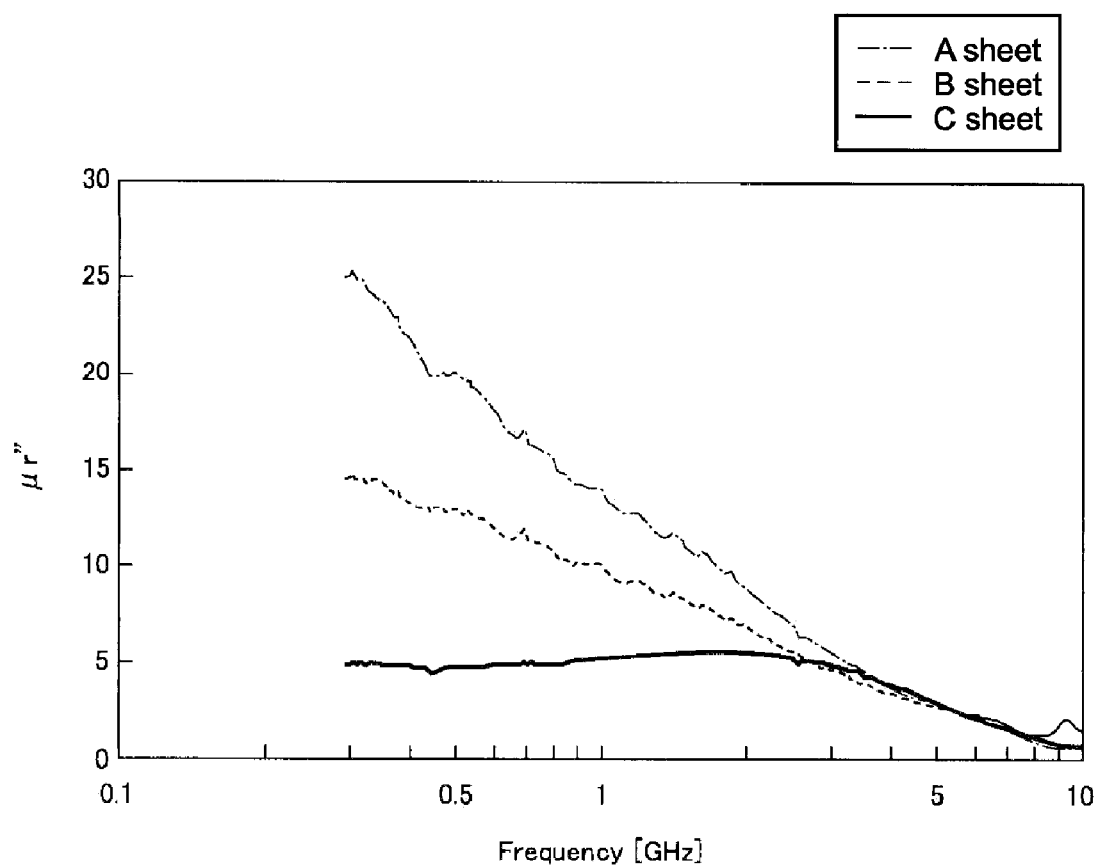
FIG. 11 is a graph showing a measurement result of a magnetic permeability of each of commercially-available electromagnetic wave suppression sheets.

A commercially-available electromagnetic wave suppression sheet having a high magnetic permeability characteristic has a larger magnetic permeability than the sample 1 in MHz band, but the imaginary part $\mu_r''$ of the commercially-available electromagnetic wave suppression sheet in the GHz band is more significantly attenuated than that of the sample 1. This is obvious from FIG. 11 described above.

Next, a sample of the electromagnetic wave suppression sheet was designed and produced so that various magnetic characteristics (coercive force and saturation magnetization) were obtained in the sheet state.

Subsequently, a saturation magnetization Ms [Wb/m$^2$] and a coercive force Hc [A/m] at a time when an external magnetic field of 1 kOe in an in-plane direction of the sheet was applied were measured. For the measurement of the saturation magnetization Ms, a vibrating sample magnetometer (VSM) manufactured by Toei Industry Co., Ltd. was used. For the measurement of the coercive force Hc, an automatic measurement coercimeter manufactured by Tohoku Steel Co., Ltd. was used.

Further, the imaginary part $\mu_r''$ of the magnetic permeability at 5 GHz was obtained.

Figure 3:
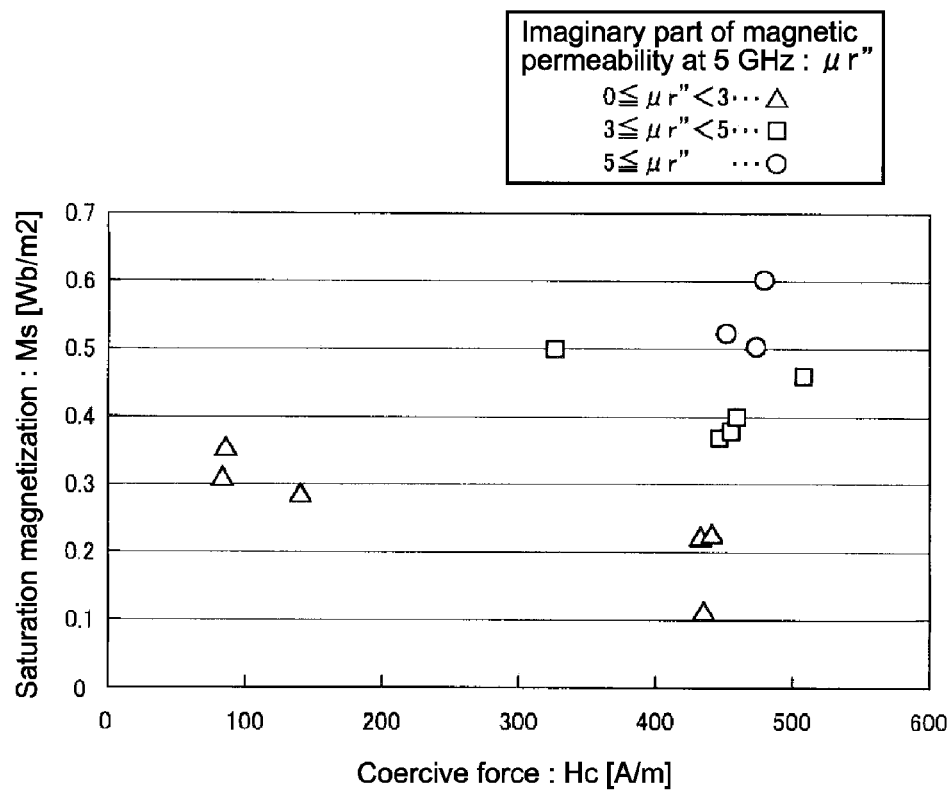
FIG. 3 is a graph showing a relationship among a coercive force, saturation magnetization, and the imaginary part $\mu_r''$ of each sample of the electromagnetic wave suppression sheets.

FIG. 3 shows a relationship among the coercive force, the saturation magnetization, and the imaginary part $\mu_r''$.

In FIG. 3, the imaginary part $\mu_r''$ of the magnetic permeability is distinguished as follows.

In a case of $0 \leq \mu_r'' \leq 3$, the imaginary part $\mu_r''$ is indicated by a triangle.

In a case of $3 \leq \mu_r'' \leq 5$, the imaginary part $\mu_r''$ is indicated by a square.

In a case of $5 \leq \mu_r''$, the imaginary part $\mu_r''$ is indicated by a circle.

As shown in FIG. 3, with increase in the saturation magnetization and the coercive force of the sheet, the imaginary part $\mu_r''$ at 5 GHz becomes larger.

Figure 4:
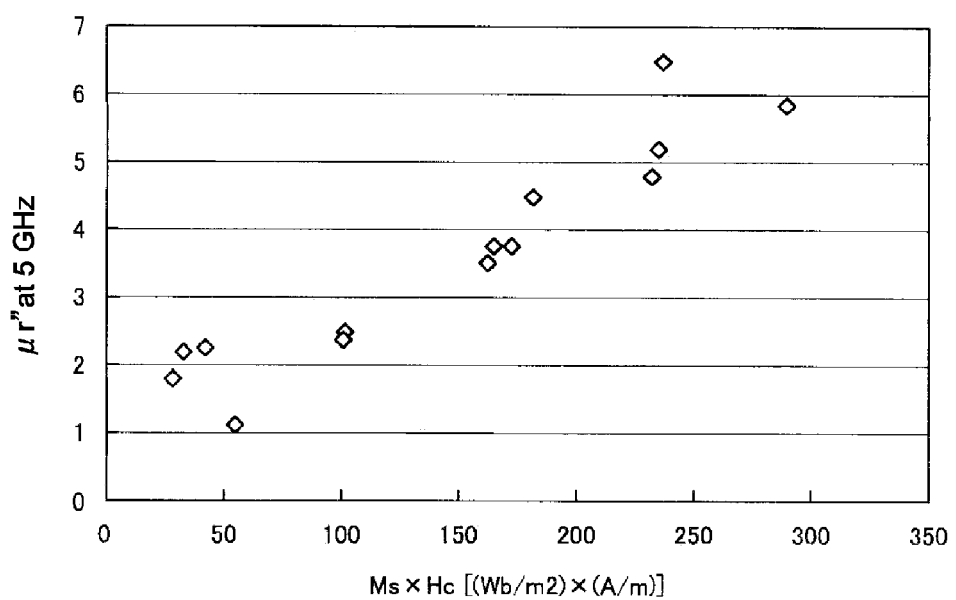
FIG. 4 is a graph showing a relationship between the imaginary part $\mu_r''$ at 5 GHz and a value of a product Ms*Hc of each of the same samples of FIG. 3.

In addition, FIG. 4 shows a relationship between a product Ms*Hc [(Wb/m$^2$)*(A/m)] and the imaginary part $\mu_r''$ at 5 GHz for the same sample measurement values.

As shown in FIG. 4, the product Ms*Hc and the imaginary part $\mu_r''$ almost has a proportional relationship. With the increase in the product Ms*Hc, the imaginary part $\mu_r''$ at 5 GHz also tends to increase.

Figure 5:
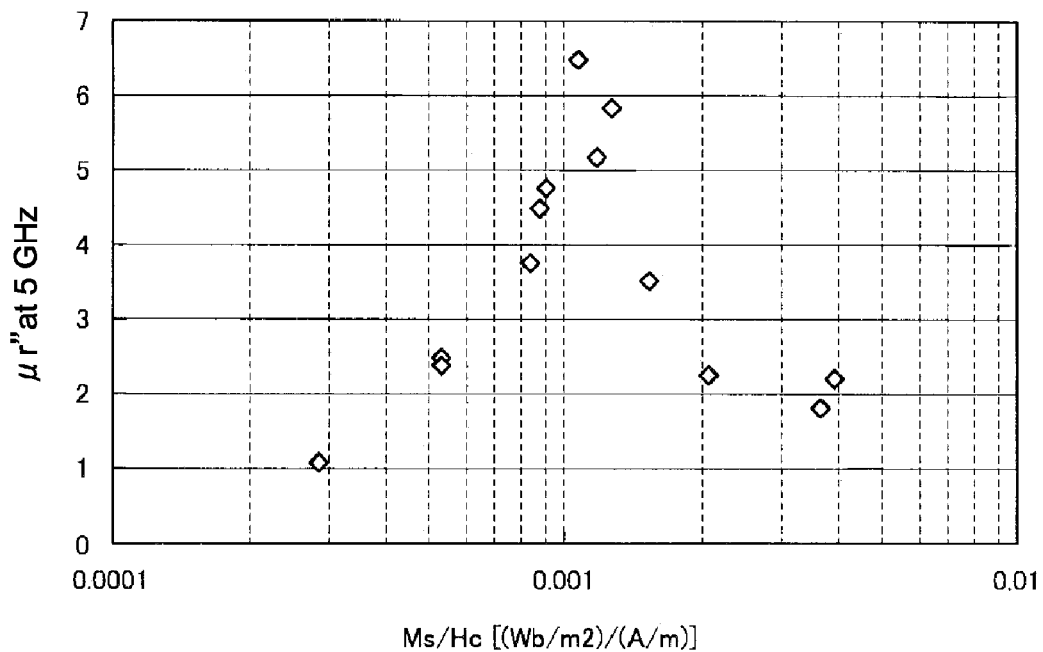
FIG. 5 is a graph showing a relationship between the imaginary part $\mu_r''$ at 5 GHz and a value of a ratio Ms/Hc of each of the same samples of FIG. 3.

In addition, FIG. 5 shows a relationship between a ratio Ms/Hc [(Wb/m$^2$)/(A/m)] and the imaginary part $\mu_r''$ at 5 GHz for the same sample measurement values.

As shown in FIG. 5, for the imaginary part $\mu_r''$ at 5 GHz, an optimal Ms/Hc value exists. Therefore, if only one of the saturation magnetization Ms and the coercive force Hc of the sheet is large, it is difficult to increase the imaginary part $\mu_r''$ at 5 GHz. In other words, in order to increase the imaginary part $\mu_r''$, an optimal design is necessary in consideration of both the saturation magnetization Ms and the coercive force Hc in the sheet state.

As shown in FIG. 5, when the value of the ratio Ms/Hc falls within the range of 0.0006 to 0.016 [(Wb/m$^2$)/(A/m)], the imaginary part $\mu_r''$ at 5 GHz becomes high, specifically, 3 or more.

The above results show that the structure of the electromagnetic suppression sheet according to the embodiment of the present invention can provide an electromagnetic suppression sheet for the GHz band, whose imaginary part $\mu_r''$ of the relative magnetic permeability is 3 or more in the 5-GHz band.

Next, with reference to the drawings, the embodiment of the present invention will be specifically described.

2. First Example of Electromagnetic Wave Suppression Sheet

FIG. 1 is a diagram showing a schematic structural diagram (cross-sectional view) of a first example of the electromagnetic wave suppression sheet according to the embodiment of the present invention.

In this embodiment, as shown in FIG. 1, metallic magnetic particles 1 are mixed into a resin 2, to thereby form an electromagnetic wave suppression sheet 10.

For the metallic magnetic particle 1, the metallic magnetic material described above can be used.

That is, it is possible to use at least one metallic magnetic material selected from among Fe, Co, a Fe—Al—Si-based alloy, a Fe—Si—Cr-based alloy, a Fe—Si-based alloy, a Fe—Ni-based alloy, a Fe—Co-based alloy, a Fe—Co—Ni-based alloy, and a Fe—Cr-based alloy.

For the resin 2, the same resin as that of the electromagnetic wave suppression sheet in related art can be used. That is, for example, the acrylic resin or the silicone-based resin described above can be used.

As shown in FIG. 1, in this embodiment, the flat metallic magnetic particles 1 are used.

It should be noted that the flat metallic magnetic particles 1 can be replaced with metallic magnetic particles having another shape, for example, spherical metallic magnetic particles can be used instead.

By using the flat metallic magnetic particles 1, it is possible to increase a filling rate of the metallic magnetic particles 1 in the resin 2.

Further, the electromagnetic wave suppression sheet 10 of this example has the magnetic characteristics of a coercive force of 320 [A/m] or more and a saturation magnetization of 0.35 [Wb/m$^2$] or more at a time when an external magnetic field of 1 kOe in an in-plane direction of the sheet is applied.

The material and shape of the metallic magnetic particle 1 and an amount of the metallic magnetic particles 1 mixed into the resin 2 are determined so that the electromagnetic wave suppression sheet 10 has the magnetic characteristics described above.

For example, the electromagnetic wave suppression sheet 10 shown in FIG. 1 can be manufactured as described below.

As the metallic magnetic particles 1, flat Fe—Cr—Si-based alloy particles each having a thickness of about 1 μm and a cross-section diameter of about 24 μm are used, for example.

Further, as the resin 2, the acrylic resin is used and a hardener is added, for example.

In addition to this, for example, toluene is used as an additional solvent in order to improve a mixed dispersion property of the metallic magnetic particle 1.

Further, for example, the metallic magnetic particles 1, the resin 2, the hardener, and the additional solvent are mixed at rates of 48.1 wt %, 44.8 wt %, 0.6 wt %, and 6.4 wt %, respectively, and stirred.

Next, the mixture is coated in a sheet shape.

Subsequently, a preliminary dry process is performed at 80° C., and a thermal hardening process is performed at 120° C.

Finally, a press process (for example, 170° C., 0.016 MPa/cm$^2$) is performed on the sheet, thereby making it possible to manufacture the electromagnetic wave suppression sheet 10 having a desired thickness.

The above-mentioned manufacturing method is merely an example of a manufacturing method of the electromagnetic wave suppression sheet, and the manufacturing method of the electromagnetic wave suppression sheet is not limited to the above-mentioned method.

For example, the size of the metallic magnetic particle 1 and the mixture ratio of the metallic magnetic particles 1, the resin 2, the hardener, and the additional solvent are not particularly limited as long as they fall within the range for satisfying the characteristics of the electromagnetic wave suppression sheet of the embodiment of the present invention.

With the structure of the electromagnetic wave suppression sheet 10 of this example described above, the magnetic characteristics of the coercive force of 320 [A/m] or more and the saturation magnetization of 0.35 [Wb/m$^2$] or more at the time when the external magnetic field of 1 kOe in an in-plane direction of the sheet is applied are obtained. Thus, in the electromagnetic wave suppression sheet 10, the imaginary part of the relative magnetic permeability at 5 GHz can be a large value, specifically, 3 or more, as described above with reference to FIGS. 2 to 3.

Accordingly, in the GHz band, a sufficient electromagnetic wave suppression effect can also be exerted.

In the first example described above, the metallic magnetic particles 1 and the resin 2 constitute the electromagnetic wave suppression sheet 10. Alternatively, in the electromagnetic wave suppression sheet 10 of the embodiment of the present invention, other particles such as nonmagnetic conductive particles may be mixed into the resin. An example in this case will be described below.

3. Second Example of Electromagnetic Wave Suppression Sheet

Figure 6:
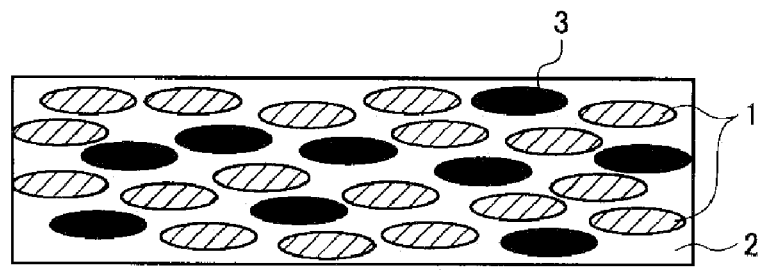
FIG. 6 is a schematic structural diagram (cross-sectional view) of an electromagnetic wave suppression sheet of a second example according to the embodiment of the present invention.

FIG. 6 is a schematic structural diagram (cross-sectional view) of a second example of an electromagnetic wave suppression sheet according to the embodiment of the present invention.

In this example, as shown in FIG. 6, the metallic magnetic particles 1 and conductive particles 3 made of nonmagnetic conductive materials are mixed into the resin 2, to thereby constitute an electromagnetic wave suppression sheet 20.

As the conductive material that forms the conductive particle 3, carbon, a conductive polymer, or the like can be used.

In this example, the conductive particles 3 also have the flat shape.

It should be noted that the flat conductive particles 3 can be replaced with conductive particles having another shape such as spherical conductive particles can be used instead.

By using the flat conductive particles 3, it is possible to increase a filling rate of the conductive particles 3 in the resin 2.

Further, the electromagnetic wave suppression sheet 20 of this example has magnetic characteristics such as a coercive force of 320 [A/m] or more and a saturation magnetization of 0.35 [Wb/m$^2$] or more at a time when an external magnetic field of 1 kOe in an in-plane direction of the sheet is applied.

The material and shape of the metallic magnetic particle 1 and an amount of the metallic magnetic particles 1 mixed into the resin 2 are determined so that the electromagnetic wave suppression sheet 20 has the magnetic characteristics described above.

The other structures are the same as the electromagnetic wave suppression sheet 10, and therefore their descriptions will be omitted.

With the structure of the electromagnetic wave suppression sheet 20 of this example, the magnetic characteristics of the coercive force of 320 [A/m] or more and the saturation magnetization of 0.35 [Wb/m$^2$] or more at the time when the external magnetic field of 1 kOe in an in-plane direction of the sheet is applied are obtained. Thus, in the electromagnetic wave suppression sheet 20, the imaginary part of the relative magnetic permeability at 5 GHz can be a large value, specifically, 3 or more, as in the electromagnetic wave suppression sheet 10 of the first example.

Further, in the electromagnetic wave suppression sheet 20, in particular, by mixing the conductive particles 3 into the resin 2, the imaginary part $\in$" of the dielectric constant becomes larger as can be seen from the expression (1) above.

As a result, electric field components of the electromagnetic wave can also be suppressed, with the result that a more excellent electromagnetic wave suppression sheet can be provided.

4. Third Example of Electromagnetic Wave

Figure 7:
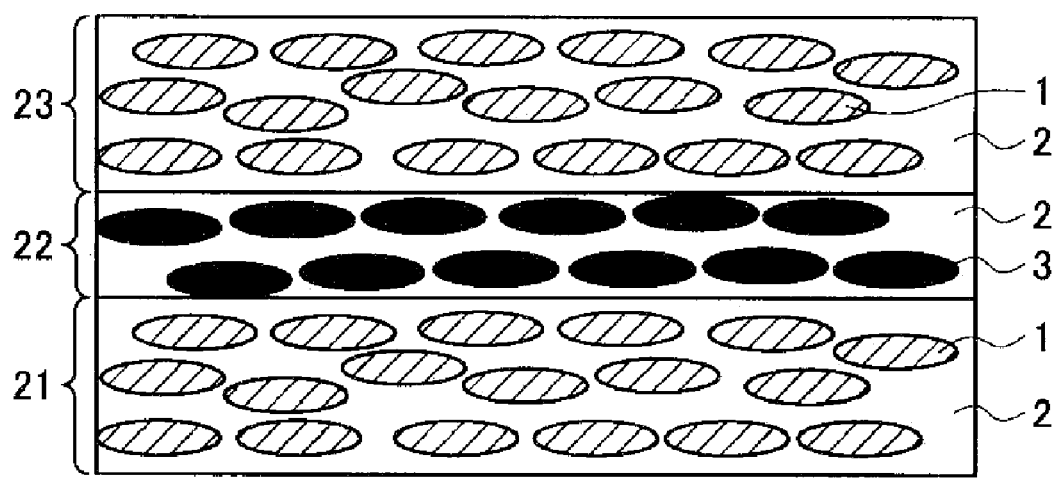
FIG. 7 is a schematic structural diagram (cross-sectional view) of an electromagnetic wave suppression sheet of a third example according to the embodiment of the present invention.

FIG. 7 is a schematic structural diagram (cross-sectional view) of a third example of an electromagnetic wave suppression sheet according to the embodiment of the present invention.

In this example, as shown in FIG. 7, an electromagnetic wave suppression sheet 30 is structured by layering a first layer 21, a second layer 22, and a third layer 23. The first layer 21 is obtained by mixing the metallic magnetic particles 1 into the resin 2. The second layer 22 is obtained by mixing the conductive particles 3 into the resin 2. The third layer 23 is obtained by mixing the metallic magnetic particles 1 into the resin 2.

As the conductive material of the conductive particle 3, carbon, a conductive polymer, or the like can be used as in the second example.

In addition, the electromagnetic wave suppression sheet 30 of this example has magnetic characteristics of the saturation magnetization of 0.35 [Wb/m$^2$] or more and the coercive force of 320 [A/m] or more in the entire sheet 30 at a time when the external magnetic field of 1 kOe in an in-plane direction of the sheet is applied.

The material and shape of the metallic magnetic particle 1 and an amount of the metallic magnetic particles 1 mixed into the resin 2 are determined so that the entire electromagnetic wave suppression sheet 30 has the magnetic characteristics described above.

With the structure of the electromagnetic wave suppression sheet 30 of this example, the first layer 21 and the third layer 23 that are obtained by mixing the metallic magnetic particles 1 into the resin 2 can provide the electromagnetic wave suppression effect. In addition, the magnetic characteristics of the coercive force of 320 [A/m] or more and the saturation magnetization of 0.35 [Wb/m$^2$] or more in the entire sheet 30 at the time when the external magnetic field of 1 kOe in an in-plane direction of the sheet is applied are obtained. Thus, in the electromagnetic wave suppression sheet 30, the imaginary part of the relative magnetic permeability at 5 GHz can be a large value, specifically, 3 or more, as in the electromagnetic wave suppression sheets 10 and 20 of the first and second examples.

Further, as in the electromagnetic wave suppression sheet 20 of the second example, by the second layer 22 obtained by mixing the conductive particles 3 into the resin 2, the imaginary part ∈" of the dielectric constant becomes larger. Therefore, the electric field components of the electromagnetic wave can also be suppressed.

As a result, a more excellent electromagnetic wave suppression sheet can be provided.

5. Example of Device

Figure 8A:
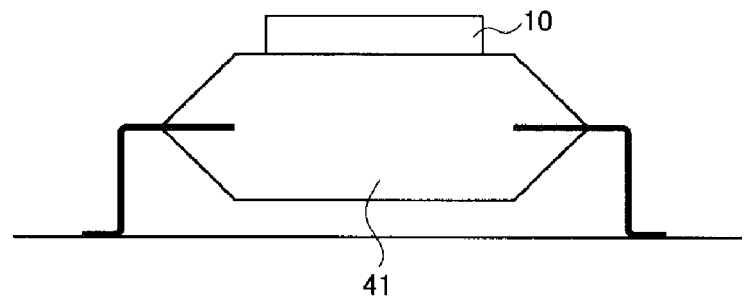
FIGS. 8A to 8C are schematic structural diagrams each showing an example of a device according to the embodiment of the present invention.
Figure 8B:
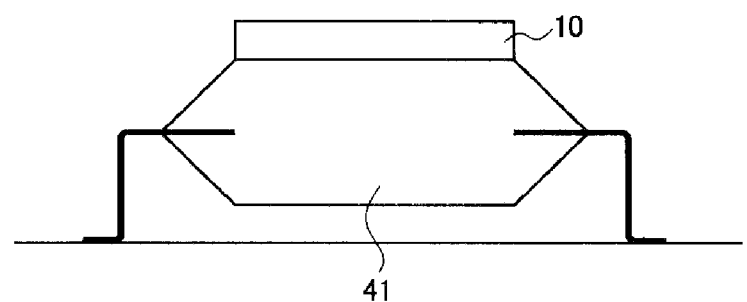
Figure 8C:
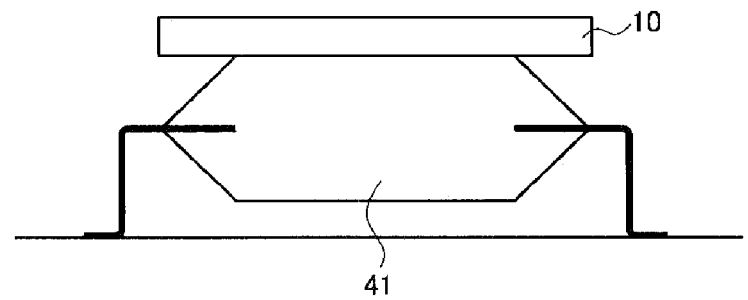

FIGS. 8A to 8C are schematic structural diagrams each showing an example of a device according to the embodiment of the present invention.

In any cases of FIGS. 8A to 8C, the electromagnetic wave suppression sheet 10 according to the embodiment of the present invention shown in FIG. 1 is bonded to an upper surface of a package 41 of an integrated circuit element such as an IC chip, thereby obtaining an integrated device.

In FIG. 8A, the electromagnetic wave suppression sheet 10 is bonded to a part of the upper surface of the package 41 of the integrated circuit element, thereby forming the device.

In FIG. 8B, the electromagnetic wave suppression sheet 10 is bonded to an entire upper surface of the package 41 of the integrated circuit element, thereby forming the device.

In FIG. 8C, the electromagnetic wave suppression sheet 10 having a larger area than the upper surface of the package 41 of the integrated circuit element is bonded thereto, thereby forming the device.

Because the electromagnetic wave suppression sheet 10 is bonded to the upper surface of the package 41 of the integrated circuit element and the integrated device is formed, the device can be distributed in the integrated state. In addition, it is also possible to sell the devices as components to makers that manufacture electronic apparatuses by using integrated circuit elements.

The device is desirable particularly in the case where a drive frequency of the integrated circuit element is in the GHz band, because the electromagnetic wave suppression sheet 10 exerts a sufficient electromagnetic wave suppression effect in the GHz band.

In the example shown in FIGS. 8A to 8C, the electromagnetic wave suppression sheet 10 is bonded to the upper surface of the package 41 in any cases.

In addition, for example, the electromagnetic wave suppression sheet can be bonded to a lower surface of the package or bonded to each of the upper and lower surfaces of the package, thereby forming the device.

6. Example of Electronic Apparatus

Figure 9:
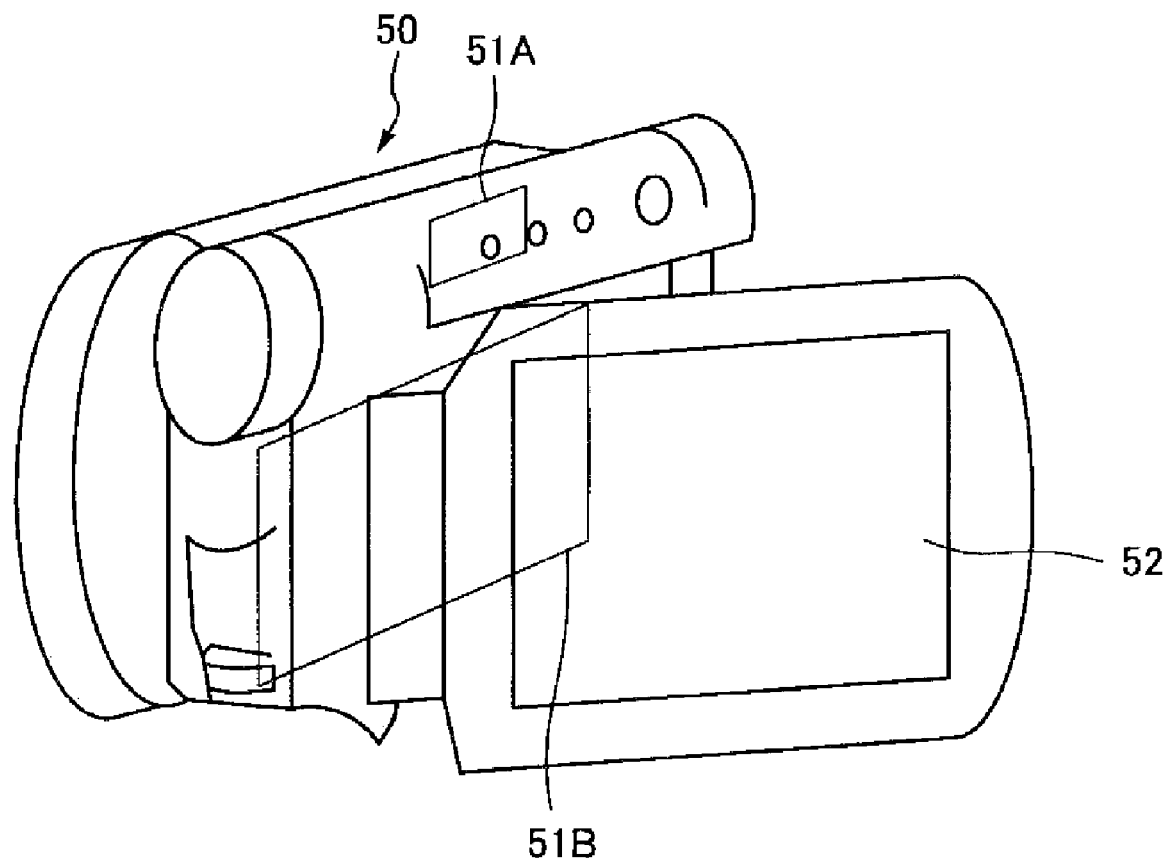
FIG. 9 is a schematic perspective view of a video camera as an example of an electronic apparatus according to the embodiment of the present invention.

FIG. 9 is a schematic perspective view of a video camera as an example of an electronic apparatus of the embodiment of the present invention.

As shown in FIG. 9, a video camera 50 incorporates therein an A substrate (printed circuit board) 51A on which electronic components are implemented and a B substrate (printed circuit board) 51B on which electronic components are implemented, and further includes a monitor screen 52.

Figure 10:
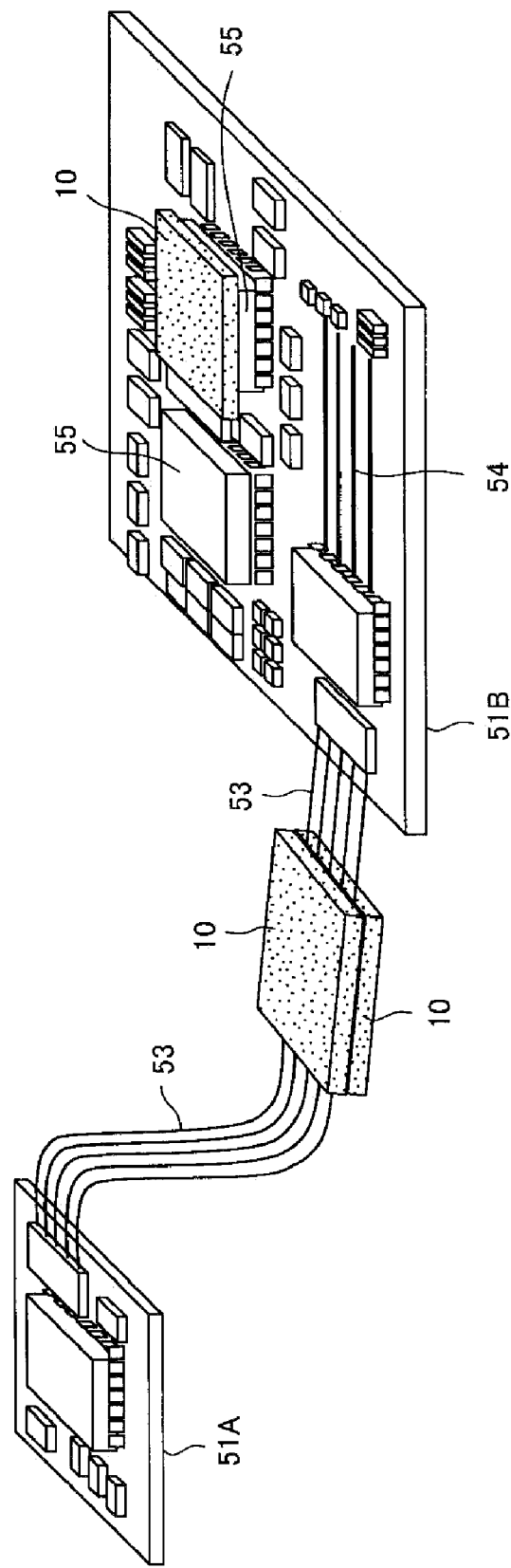
FIG. 10 is a perspective view of a main part of the video camera shown in FIG. 9.

FIG. 10 is a perspective view of a main part of the video camera 50.

As shown in FIG. 10, the electromagnetic wave suppression sheets 10 of FIG. 1 according to the embodiment of the present invention are disposed to sandwich a flexible wiring substrate 53 in which wirings for electrically connecting the A substrate 51A and the B substrate 51B with each other are formed. Further, the electromagnetic wave suppression sheet 10 is bonded to an upper surface of an IC chip (integrated circuit element) 55 implemented on the B substrate 51B.

It should be noted that it is also possible to dispose the electromagnetic wave suppression sheet of the embodiment of the present invention on the upper surface of the IC chip 55 of the A substrate 51A shown in FIG. 10 or in the vicinity of a wiring 54 on the B substrate 51B.

By disposing the electromagnetic wave suppression sheet 10 in the vicinity of the IC chip (integrated circuit element) 55 or the wirings 53 and 54 as in this example, it is possible to suppress the emission of the electromagnetic wave generated from the IC chip 55 or the wirings 53 and 54.

Because the electromagnetic wave suppression sheet 10 has the sufficient electromagnetic wave suppression effect in the GHz band, the electronic apparatus is desirable particularly in a case where a drive frequency of the IC chip 55 is in the GHz band.

As described above, the electromagnetic wave suppression sheet 10 of the embodiment of the present invention is provided on at least one of a part where an internal electromagnetic wave is generated and a part where an external electromagnetic wave acts, with the result that an influence of the electromagnetic wave on the electronic apparatus or an influence of the electromagnetic wave from the electronic apparatus can be minimally suppressed.

As a result, the electronic apparatus having the electromagnetic compatibility and high reliability in stable operation can be realized.

In the examples of the device and the electronic apparatuses described above, the electromagnetic wave suppression sheet 10 shown in FIG. 1 is used.

Instead of the electromagnetic wave suppression sheet 10 shown in FIG. 1, when the electromagnetic wave suppression sheet 20 or 30 shown in FIG. 6 or 7 or an electromagnetic wave suppression sheet having another structure according to the present invention is used, the device of the present invention and the electronic apparatus of the present invention can be structured in the same way.

The present invention is not limited to the above embodiment and can be variously modified without departing from the gist of the present invention.

The present application contains subject matter related to that disclosed in Japanese Priority Patent Application JP 2008-312553 filed in the Japan Patent Office on Dec. 8, 2008, the entire content of which is hereby incorporated by reference.

What is claimed is:

1. An electromagnetic wave suppression sheet comprising metallic magnetic particles mixed into a resin and formed into a sheet shape, wherein the electromagnetic wave suppression sheet has a coercive force of 320 A/m or more and a saturation magnetization of 0.35 Wb/m$^2$ or more at a time when an external magnetic field of 1 kOe in an in-plane direction is applied.

2. The electromagnetic wave suppression sheet of claim 1, having a value of (the saturation magnetization at the time when the external magnetic field is applied)/(the coercive force) within a range of 0.0006 to 0.0016 (Wb/m$^2$)/(A/m).

3. The electromagnetic wave suppression sheet of claim 1, wherein the metallic magnetic particle has one of a flat shape and a spherical shape.

4. The electromagnetic wave suppression sheet of claim 1, having an imaginary part of a relative magnetic permeability of 3 or more at 5 GHz.

5. The electromagnetic wave suppression sheet of claim 1, wherein the metallic magnetic particle is made of at least one metallic magnetic material selected from a group consisting of Fe, Co, a Fe—Al—Si-based alloy, a Fe—Si—Cr-based alloy, a Fe—Si-based alloy, a Fe—Ni-based alloy, a Fe—Co-based alloy, a Fe—Co—Ni-based alloy, and a Fe—Cr-based alloy.

6. The electromagnetic wave suppression sheet of claim 1, wherein the resin has particles of a conductive material mixed therein in addition to the metallic magnetic particles.

7. The electromagnetic wave suppression sheet of claim 1, wherein a layer in which the metallic magnetic particles are mixed into the resin and a layer in which a conductive material is mixed into a resin are layered.

8. The electromagnetic wave suppression sheet of claim 1, having a coercive force of 450 A/m or more and a saturation magnetization of 0.5 Wb/m$^2$ or more at a time when an external magnetic field of 1 kOe in an in-plane direction is applied.

9. The electromagnetic wave suppression sheet of claim 1, having a value of (the saturation magnetization at the time when the external magnetic field is applied)/(the coercive force) within a range of 0.0009 to 0.0013 (Wb/m$^2$)/(A/m).

10. The electromagnetic wave suppression sheet of claim 1, having an imaginary part of a relative magnetic permeability of 5 or more at 5 GHz.

11. A device, comprising:
an integrated circuit element package; and
an electromagnetic wave suppression sheet comprising metallic magnetic particles mixed into a resin and formed into a sheet shape, the electromagnetic wave suppression sheet having a coercive force of 320 A/m or more and a saturation magnetization is of 0.35 Wb/m$^2$ or more at a time when an external magnetic field of 1 kOe in an in-plane direction is applied, the electromagnetic wave suppression sheet being bonded to the package of the integrated circuit element.

12. The device of claim 11, wherein the electromagnetic wave suppression sheet has a coercive force of 450 A/m or more and a saturation magnetization of 0.5 Wb/m$^2$ or more at a time when an external magnetic field of 1 kOe in an in-plane direction is applied.

13. The device of claim 11, wherein the electromagnetic wave suppression sheet has a value of (the saturation magnetization at the time when the external magnetic field is applied)/(the coercive force) within a range of 0.0009 to 0.0013 (Wb/m$^2$)/(A/m).

14. The device of claim 11, wherein the electromagnetic wave suppression sheet has an imaginary part of a relative magnetic permeability of 5 or more at 5 GHz.

15. An apparatus, comprising:
an integrated circuit element;
a wiring; and
an electromagnetic wave suppression sheet comprising metallic magnetic particles mixed into a resin and formed into a sheet shape, the electromagnetic wave suppression sheet having a coercive force of 320 A/m or more and a saturation magnetization of 0.35 Wb/m$^2$ or more at a time when an external magnetic field of 1 kOe in an in-plane direction is applied, the electromagnetic wave suppression sheet being disposed in a vicinity of one of the integrated circuit element and the wiring.

16. The apparatus of claim 15, wherein the electromagnetic wave suppression sheet has a coercive force of 450 A/m or more and a saturation magnetization of 0.5 Wb/m$^2$ or more at a time when an external magnetic field of 1 kOe in an in-plane direction is applied.

17. The apparatus of claim 15, wherein the electromagnetic wave suppression sheet has a value of (the saturation magnetization at the time when the external magnetic field is applied)/(the coercive force) within a range of 0.0009 to 0.0013 (Wb/m$^2$)/(A/m).

18. The apparatus of claim 15, wherein the electromagnetic wave suppression sheet has an imaginary part of a relative magnetic permeability of 5 or more at 5 GHz.

* * * * *